United States Patent
Gosset et al.

(10) Patent No.: US 8,097,949 B2
(45) Date of Patent: Jan. 17, 2012

(54) CONTROL OF LOCALIZED AIR GAP FORMATION IN AN INTERCONNECT STACK

(75) Inventors: Laurent Gosset, Grenoble (FR); Jean Raymond Jacques Marie Pontcharra, Quaix-en-Chartreuse (FR); Frederic Gaillard, Voiron (FR)

(73) Assignees: NXP B.V., Eindhoven (NL); Commissariat a l'Energie Atomique, Paris (FR)

( * ) Notice: Subject to any disclaimer, the term of this patent is extended or adjusted under 35 U.S.C. 154(b) by 357 days.

(21) Appl. No.: 12/295,568

(22) PCT Filed: Mar. 21, 2007

(86) PCT No.: PCT/EP2007/052673
§ 371 (c)(1),
(2), (4) Date: Sep. 30, 2008

(87) PCT Pub. No.: WO2007/113108
PCT Pub. Date: Oct. 11, 2007

(65) Prior Publication Data
US 2009/0243108 A1    Oct. 1, 2009

(30) Foreign Application Priority Data
Mar. 30, 2006    (EP) ................................ 06300305

(51) Int. Cl.
*H01L 23/48* (2006.01)
*H01L 23/52* (2006.01)
*H01L 29/40* (2006.01)
*H01L 21/4763* (2006.01)
*H01L 21/76* (2006.01)

(52) U.S. Cl. .............. 257/758; 257/295; 257/E21.586; 257/E21.564; 257/E21.581; 257/E21.573; 438/421; 438/619; 438/637

(58) Field of Classification Search ............... 257/758, 257/295, E23.145, E21.564, E21.581, E21.573; 438/637, 421, 619
See application file for complete search history.

(56) References Cited

U.S. PATENT DOCUMENTS 6,064,118 A * 5/2000 Sasaki .................... 257/758
(Continued)

FOREIGN PATENT DOCUMENTS
WO    WO 2005034200 A2    4/2005
(Continued)

OTHER PUBLICATIONS

Z. Gabric, W. Pamler, G. Schindler, W. Steinhogl, and M. Traving; Air Gap Technology by Selective Ozone/TEOS Deposition; Infineon Technologies, Corporate Research; 2004 IEEE; p. 151-153.

*Primary Examiner* — Zandra Smith
*Assistant Examiner* — Jeremy Joy

(57) ABSTRACT

The present invention relates to a method for fabricating an interconnect stack of an integrated-circuit device. Air gaps are fabricated in the interconnect stack on one or more interconnect levels. The method comprises forming local etch vias (216, 218) between a lower etch-barrier layer (236) and an upper etch-barrier layer (211) on top of an upper-intermediate interconnect level (224). Lateral inhomogeneities of the dielectric constant on the upper-intermediate interconnect level are removed in comparison with prior-art devices. For in the finished interconnect stack local variations in the dielectric permittivity can only occur at the (former) etch vias, which are either visible by the presence of air cavities or hardly visible due to a later filling with the dielectric material of the next interlevel dielectric layer. The integrated-circuit device of the invention completely avoids a penetration of copper from the metal interconnect line sections into the adjacent interlevel or intermetal dielectric layers.

8 Claims, 6 Drawing Sheets

U.S. PATENT DOCUMENTS

| | | |
|---|---|---|
| 6,228,770 B1 | 5/2001 | Pradeep et al. |
| 6,245,658 B1 * | 6/2001 | Buynoski ............... 438/619 |
| 6,297,125 B1 * | 10/2001 | Nag et al. ............... 438/421 |
| 6,413,852 B1 * | 7/2002 | Grill et al. ............... 438/619 |
| 6,713,835 B1 * | 3/2004 | Horak et al. ............ 257/522 |
| 7,936,563 B2 * | 5/2011 | Gosset et al. ........... 361/689 |
| 2001/0014526 A1 * | 8/2001 | Clevenger et al. ...... 438/619 |
| 2004/0229454 A1 | 11/2004 | Torres et al. |
| 2005/0167841 A1 * | 8/2005 | Papa Rao et al. ....... 257/758 |

FOREIGN PATENT DOCUMENTS

WO    WO 2005071739 A2    8/2005

* cited by examiner

CONTROL OF LOCALIZED AIR GAP FORMATION IN AN INTERCONNECT STACK

The present invention relates to an integrated-circuit device that has an interconnect stack on a substrate. The invention also relates to a method for fabricating an interconnect stack of an integrated-circuit device.

Interconnect stacks of integrated-circuit devices have been subjected to continuous development along the predictions of the International Technology Roadmap for Semiconductors (ITRS). Size, capacitance values between the interconnect lines and, correspondingly, cross talk and RC delays have been reduced.

One focus has been on the reduction of the dielectric permittivity k of the intermetal dielectric layers sections of the interconnect stack. An ultimate reduction can be achieved by replacing commonly used low-k materials by air or vacuum as the insulating material. This has for instance been described in US 2004/0229454 A1. Air gaps are provided on a number of lower interconnect levels of an interconnect stack. Laterally, the air gaps are restricted to only a defined portion of the substrate. The interconnect stack described in this document thus contains upper interconnect levels, in which no air gaps are provided.

The processing scheme of US 2004/0229454 A1 to achieve air gap integration within a multi-level interconnect stack comprises an alternating deposition of SiLK as the intermetal dielectric layer and of undoped silicon glass (USG) layers as the interlevel dielectric layer. Copper metal line sections are prepared in the intermetal dielectric layer on every interconnect level, and vias are integrated into the interlevel dielectric layers, according to the well-known dual damascene processing. After formation of the interconnect stack up to an intermediate interconnect level, an etch-barrier layer is deposited and laterally structured to define the area in which air gaps are to be formed. The lateral border of this region is defined by a lateral etch barrier that extends from the bottom interconnect level to the etch-barrier-layer on top of the intermediate interconnect level.

Subsequently, hydrogenfluoride (HF) is applied to the unmasked region. HF removes the USG layer of the intermediate intermetal layer and penetrates through the underlying SiLK layer to attack the USG-layer of the interconnect level next below, and continues to spread until it reaches and attacks the intermetal dielectric layer of the bottom interconnect level. This way, air gaps are formed in a laterally defined region and on interconnect levels below the etch-barrier layer. After the formation of air gaps, processing is continued with the formation of the dielectric layer for the top interconnect level.

Since the aspect ratio of the trenches between the metal lines on the intermediate interconnect level varies, a non-conformal deposition of the dielectric layer using known plasma-enhanced chemical vapor deposition techniques leads to a formation of air cavities between the metal lines of the intermediate level. The term air cavity is used here to make a distinction over the air gaps produced on interconnect levels below the intermediate interconnect level. The air-cavity shape (width and height) varies with the aspect ratio of the trenches. Similarly, the width and the closure height of the air cavities will vary.

To further elucidate the air-gap processing in the prior art and problems related to this approach, reference is now made to FIG. 1. FIG. 1 is a schematic cross-sectional view of the intermediate and the top interconnect level of an interconnect stack 100. The layer sequence shown in FIG. 1 comprises an intermediate interlevel dielectric layer 102 containing metal vias 104 and 106, an intermediate intermetal dielectric layer 108 containing metal interconnect line sections 110, 112 and 114, a top interlevel dielectric layer 116 containing metal vias 118, 120 and 122, and a top intermetal dielectric layer 124 containing interconnect metal line sections 126 and 128. An etch-barrier-layer 130 is formed on top of the intermediate interconnect level.

As a consequence of a non-conformal plasma-enhanced CVD technique used for deposition of the top dielectric layers 116 and 124, air cavities 132, 134 and 136 have been formed in the trenches between the metal interconnect lines 104 and 106, as well as between the metal interconnect lines and lateral etch-barriers 138 and 140. The closure height of the air cavities 132 to 136 varies depending on the width of a respective trench. The wider the trench, the higher is the closure height of the air cavities. A problematic region, in which the air cavity 136 and the metal interconnect line section 128 overlap, is highlighted in FIG. 1 by a circle 142. This situation results in an opening of air cavity 136 during the fabrication of the metal interconnect line section 128. This is likely to lead to an intrusion of metal (copper) into the air cavity. As is well-known, copper diffusion in the interconnect stack causes reliability problems.

The dielectric material used for the top dielectric layers 116 and 124 typically differs from that used at the intermediate interconnect level 108 in its dielectric permittivity. Due to the opening in the etch-barrier-layer 130, the material of the top interlevel dielectric layer 116 is also deposited in some sections of the intermediate interconnect level 108. The dielectric permittivity and thus the performance of the interconnect stack thus varies between the different lateral areas. This may lead to undesired effects during operation of the integrated-circuit device.

Furthermore, cappings (e.g., as indicated by circles 148 and 150) of the interconnect line sections at the intermediate interconnect level 108 vary depending on whether they are provided inside or outside the opening defined by the lateral etch-barriers 138 and 140. Interconnect line segment 114, which is located outside the opening, is capped with the etch-barrier-layer, which may for instance be made from SiC. In contrast, the metal interconnect line sections 110 and 112 are capped with self-aligned barriers typically made of materials like CoWP, CuSiN etc. This may cause different reliability performances in the areas inside (e.g., as indicated by circle 146) and outside (e.g., as indicated by circle 144) the lateral etch-barriers 138 and 140.

Similar problems are observed, if instead of a non-conformal PECVD deposition technique a spin-on deposition technique is used for the upper dielectric layers. Since the space between the metal interconnect lines in the opened area must be filled, the deposition technique for the dielectric must be a gap-fill process. Otherwise, many undesired air cavities will remain at this level, which is a major cause of via misalignment. Via misalignment may cause the intrusion of copper into remaining air cavities, thus resulting in undesired copper diffusion into the interconnect stack. Even if this problem were solved, the use of this alternative deposition technique would not alter the situation with respect the presence of different dielectric materials on the intermediate interconnect level 108, which leads to a difference in the effective dielectric constant in different lateral sections of the interconnect level. In addition, the described difference in the reliability performance that is caused by using different cappings for the metal interconnect line sections on the intermediate interconnect level 108 are also present when using a spin-on deposition technique.

It is therefore an object of the present invention to provide a method for fabricating an interconnect stack of an integrated-circuit device, which method allows improving the reliability performance of the interconnect stack in the presence air gaps at lower interconnect levels.

It is another object of the present invention to provide an integrated-circuit device, which has an interconnect stack with air gaps at lower interconnect levels, which integrated-circuit device has an improved reliability.

For reasons of clarity, the following description will first turn to the method aspect of the present invention before turning to the device aspect.

According to a first aspect of the invention, a method is provided for fabricating an interconnect stack of an integrated-circuit device, comprising a step of forming an interconnect stack with a plurality of interconnect levels. The interconnect stack to be formed extends from a bottom interconnect level at a smallest distance from a reference surface of the substrate to a top interconnect level at a largest distance from the reference surface. The method comprises the steps of:
- fabricating respective interconnect levels, which contain metal interconnect line sections extending parallel to the reference substrate surface and between intermetal-dielectric layer sections of the respective interconnect level,
- fabricating a lower etch-barrier layer, which is impermeable for a selective etchant that attacks the intermetal-dielectric layer sections, either on top of a lower-intermediate interconnect level or immediately before fabrication of an upper-intermediate interconnect level,
- fabricating an upper etch-barrier layer on top of the upper-intermediate interconnect level, the upper etch-barrier layer being impermeable for the selective etchant,
- fabricating at least one respective etch opening in the upper and lower etch-barrier layers, and at least one respective etch via connecting two respective etch openings on the upper and lower etch-barrier layers,
- fabricating a lateral etch-barrier liner, which extends along side walls of the etch via and is impermeable for the selective etchant, and
- fabricating airgaps on one or more interconnect levels, which are arranged below the lower etch-barrier layer, by applying the selective etchant through the etch via.

The terms bottom, top, upper and lower, above, and below are used herein to describe arrangements of structural elements of the interconnect stack in relation to a reference surface of the substrate or in relation to each other with respect to the reference surface. For example, the bottom interconnect level is an interconnect level that has a lower distance from the reference surface than all other interconnect levels, and a top interconnect level is an interconnect level that has a larger distance from the reference surface than all other interconnect levels. A first layer that is arranged below a second layer has a smaller distance from the reference surface than the second layer. A reference surface of the substrate is for instance the surface of the unprocessed wafer before circuit elements and the interconnect stack are fabricated on it. The opposite wafer surface, usually referred to as the backside of the wafer, forms an equally suitable reference surface. In any case, the orientation of the integrated-circuit device in space is not relevant for the correct interpretation of the terms mentioned at the beginning of this paragraph.

The term interconnect level is used herein for a layer containing metal interconnect sections and intermetal dielectric layer sections between them, both at a given (equal) distance from the reference substrate surface. It is important to distinguish between intermetal dielectric layers and interlevel dielectric layers. The latter are not considered an integral part of a respective interconnect layer for the purpose of the present definition. Rather, they are arranged between two respective neighboring interconnect levels.

The method of the invention employs at least one etch via between an upper intermediate interconnect level and a lower intermediate interconnect level for forming air gaps at interconnect levels below the lower intermediate interconnect level. The etch via has a much smaller lateral extension than the lateral region of the interconnect stack that is to contain air gaps. It forms a channel for conducting the selective etchant from the upper-intermediate interconnect level to the lower interconnect levels. The volume of an etch via is defined by a lateral etch-barrier-liner that covers its sidewalls. The etch-barrier liner is impermeable for the selective etchant that is used to form the air gaps, and thus protects surrounding material from the selective etchant during the etching step.

For protection of material surrounding the etch via, the method of the invention also comprises the formation of both an upper etch-barrier-layer on top of the upper intermediate interconnect level, and of a lower etch-barrier-layer below the upper etch-barrier-layer. The lower etch-barrier-layer can either be formed on top of the lower intermediate interconnect level, or underneath the upper-intermediate interconnect level. In the latter alternative it is deposited immediately before the fabrication of the upper intermediate interconnect level.

However, the use of the etch-barrier layers according to the invention is not restricted to protection. The method of the invention also allows using the same low-k barrier, namely, the upper etch-barrier-layer, as a capping for the metal interconnect line sections on top of the upper-intermediate interconnect level. Therefore, this reliability problem is removed by the method of the invention.

Furthermore, since the selective etchant for forming the air gaps is conducted through the upper-intermediate interconnect level by means of the etch vias, the upper-intermediate interconnect level remains mostly intact during the etching step. Therefore, except for the vias, the intermetal dielectric layer of the upper-intermediate interconnect level remains laterally homogenous. There is no need for a later fill-up of trench sections after the etching step. The effective dielectric constant at the upper interconnect level is therefore hardly changed at all by the processing required for introduction of air gaps of lower interconnect levels.

In summary, by localizing the access of the selective etchant for air gap formation to the etch vias and protecting the upper-intermediate interconnect level from an attack of the etchant, the harmful effects of the processing needed for air gap formation in the prior art are removed.

In the following, preferred embodiments of the method of the invention will be described. Unless stated explicitly to the contrary, the embodiments can be combined with each other.

Different embodiments of the method of the invention provide alternative ways for fabricating the top interlevel dielectric layer. The top interlevel dielectric layer is arranged above the upper etch-barrier-layer.

In a first alternative embodiment this involves a deposition of the top interlevel dielectric layer by a deposition technique that will not fill the etch via. Such deposition techniques may for instance be selective conformal or non-conformal chemical vapor deposition, or a non-filling spin-on technique. Since the etch vias can be formed with equal aspect ratios, this step will result in homogenously-shaped air cavities extending in and above the etch vias up to substantially equal levels. This way a break-through of interconnect line sections into the air cavities above the etch vias is prohibited. The lateral inhomogeneity of the intermetal dielectric layer of the upper-intermediate interconnect level is restricted o the (former) etch vias, which will exhibit a locally reduced dielectric permittivity. This contribution to the effective dielectric permittivity is rather small and thus does not harmfully influence the device reliability. This first alternative embodiment may potentially lead to a slight deposition of the interlevel dielectric material at the edges of the etch vias and underneath the etch vias.

In a second alternative embodiment, the step of depositing the top interlevel dielectric layer uses a deposition technique that will fill the etch via. This can be realized by a suitable spin-on process. In this embodiment, the lateral inhomogeneity of the intermetal dielectric layer of the upper-intermediate interconnect level is restricted to the (former) etch vias as well. This contribution is rather small and thus not harmfully influence the device reliability.

In a further embodiment, a lateral etch-barrier is fabricated before the fabrication of the air gaps. The lateral etch-barrier is made from a material, which is impermeable for the selective etchant. The lateral etch-barrier preferably extends from the upper etch-barrier-layer to the bottom interconnect level so as to prohibit a lateral distribution of the selective etchant on all interconnect levels with air gaps. The lateral etch-barrier is to be distinguished from the lateral etch-barrier liner. The lateral etch-barrier-layer functions as a barrier for limiting the lateral extension of the selective etchant, and thus the air gap region (or regions) on the substrate, whereas the lateral etch-barrier liner functions for protecting the sidewalls of the etch vias from an attack of the selective etchant.

In a further preferred embodiment the step of fabrication a lateral-etch-barrier liner comprises a step of depositing the etch-barrier liner on all faces of the etch via including a bottom face of the etch via, and a step of removing the etch-barrier liner from the bottom face of the etch via. The removal of the etch barrier liner from the bottom face can for instance be achieved using a reactive ion etching (RIE) process. At the same time, the etch-barrier liner material can be removed from other surface regions of the wafer, except, of course, from the sidewalls of the etch vias.

According to a second aspect of the invention, an integrated-circuit device is provided, which contains an interconnect stack on a substrate. The interconnect stack comprises a plurality of interconnect levels containing a bottom interconnect level at a smallest distance from a reference surface of the substrate and a top interconnect level at a largest distance from the reference surface, metal interconnect line sections, which extend parallel to the reference substrate surface and between intermetal-dielectric layer sections on a respective interconnect level, an upper etch-barrier layer, which is arranged on an upper-intermediate interconnect level below the top interconnect level and which is impermeable for a selective etchant that attacks the intermetal-dielectric layer sections, and a lower etch-barrier layer, which is arranged below the upper-intermediate interconnect level and which is impermeable for the selective etchant.

The upper and lower etch-barrier layers each contain at least one etch opening defined by a lateral etch-barrier liner, which extends from the etch opening in the upper etch-barrier layer to the etch opening in the lower etch-barrier layer and which is impermeable for a selective etchant. Airgaps are present on one or more interconnect levels, which are arranged below the lower etch-barrier layer.

The integrated-circuit device of the second aspect of the invention has an improved reliability performance due to the fact that the above-mentioned processing problems affecting the reliability are removed. In particular, lateral inhomogeneities of the dielectric constant on the upper-intermediate interconnect level are completely or almost completely removed in comparison with prior-art devices. This is due to fact that local variations in the dielectric permittivity can only occur at the (former) etch vias, which are either visible by the presence of air cavities or hardly visible due to a later filling with the dielectric material of the next interlevel dielectric layer. The integrated-circuit device of the invention completely avoids a penetration of copper from the metal interconnect line sections into the adjacent interlevel or intermetal dielectric layers.

Due to the presence of the lateral etch-barrier liner, the via sidewalls are impermeable for the selective etchant. In the integrated-circuit device of the invention, the lateral etch-barrier liner extends from the etch opening in the upper etch-barrier layer to the etch opening in the lower etch-barrier layer. As explained in the foregoing description of the method of the invention, an etch via for conducting the selective etchant from the upper-intermediate interconnect level to lower interconnect levels can be provided this way. The etch via as such need not remain during later processing of the interconnect stack. Similarly, the etch openings in the integrated-circuit device form a local interruption of the etch-barrier layer that may or may not be filled with another material. That means, the etch vias and the etch openings may or may not be filled in the integrated-circuit device of the present aspect of the invention, according to different respective processing embodiments described earlier. In any way, the presence of the lateral etch-barrier liner and the interruption of the etch-barrier layers form clear signs of the processing according to the invention, even if the openings in the upper and lower etch-barrier layers and/or the via between them are filled, for instance with a dielectric material.

In the following, preferred embodiments of the integrated-circuit device of the invention will be described. As before, the embodiments can be combined with each other, unless stated otherwise explicitly.

The integrated-circuit device of the invention can for instance take the form of a chip, or of a processed wafer before a separation into individual chips. The integrated-circuit device may also take the form of a system-in-package. A system-in-package typically contains several chips. Of course, if only one of a plurality of chips in a system-in-package forms an integrated-circuit device according to the present invention, the whole system-in-package does as well.

Typically, the interconnect stack further comprises metal vias for connecting interconnect line sections of two neighboring interconnect levels, and interlevel-dielectric layer sections extending parallel to the reference surface of the substrate, between the metal vias and between respective neighboring interconnect levels.

Preferably, the interlevel-dielectric layer sections are made of a material that is permeable for the selective etchant. This way, the selective etchant can reach lower interconnect levels and attack the intermetal dielectric layer sections there to form air gaps. It is a matter of course that the interlevel-dielectric layer material should be stable in contact with the selective etchant.

Should it be desired to save certain interconnect levels from the formation of air gaps, the concept of the invention can also be applied at these lower interconnect levels. That is, etch vias can be formed between two etch-barrier-layers to define the area that shall not be attacked by the selective etchant. Of course, as described before in extenso, the etch vias must be covered on their sidewalls with an etch-barrier liner to prevent diffusion of the selective etchant into the respective dielectric layers.

According to a further embodiment, an air cavity is provided between the etch openings in the upper and lower etch-barrier-layers. The air cavity forms an indication of the processing of a preferred embodiment of the invention, which has been described above. Namely, it reflects a non-gap-filling deposition process for the interlevel dielectric layer on top of the upper etch-barrier-layer. In an alternative embodiment, the etch openings in the upper and lower etch-barrier-layer are filled with a dielectric material, as described in more detail in the context of the related method embodiments above.

The lower etch-barrier-layer can in alternative embodiments either be arranged on top of a lower intermediate interconnect level, which is situated below the upper-intermediate interconnect level, or it can be arranged between the upper-intermediate interconnect level and an interlevel dielectric layer. The first alternative protects the upper-intermediate interconnect level and the underlying interlevel dielectric layer. If desired, of course, this range of protection can be extended to lower interconnect levels, thus increasing the length of the etch vias. In this embodiment, air gaps are formed immediately below the lower etch-barrier layer, and immediately below the etch vias. Therefore, during a later non-gap-filling dielectric deposition process, dielectric material may be deposited at the bottom of the etch vias.

This problem can be removed by the second alternative embodiment, in which the lower barrier layer is arranged immediately below a metal interconnect level, such as the upper-intermediate interconnect level. In this embodiment the etch vias end on an underlying interlevel dielectric layer, which is stable in contact with the selective etchant. Thus, no air gaps are arranged immediately underneath the etch vias and immediately underneath the lower etch-barrier layer. The air gaps are thus free of dielectric materials, which is deposited on top of the upper etch-barrier layer.

The formation of air gaps can laterally be limited by providing a lateral etch-barrier, which is impermeable for the selective etchant and which extends from the upper etch-barrier-layer to the bottom interconnect level.

Further embodiments of the method and device aspects of the present invention will be described next with reference to the figures.

Figure 1:
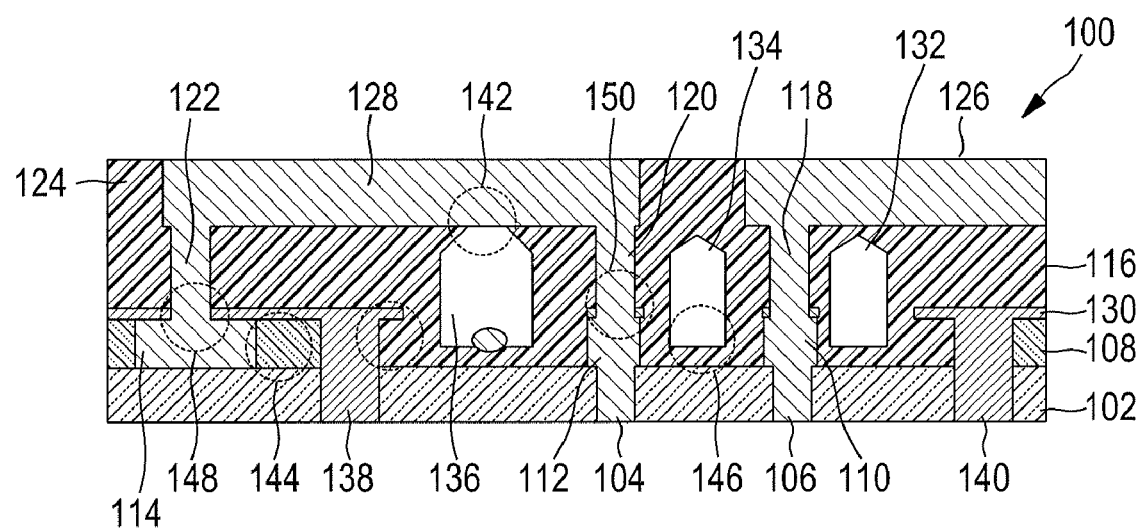
FIG. 1 shows a cross-sectional view of an upper interconnect-stack section according to the prior art.
Figure 2:
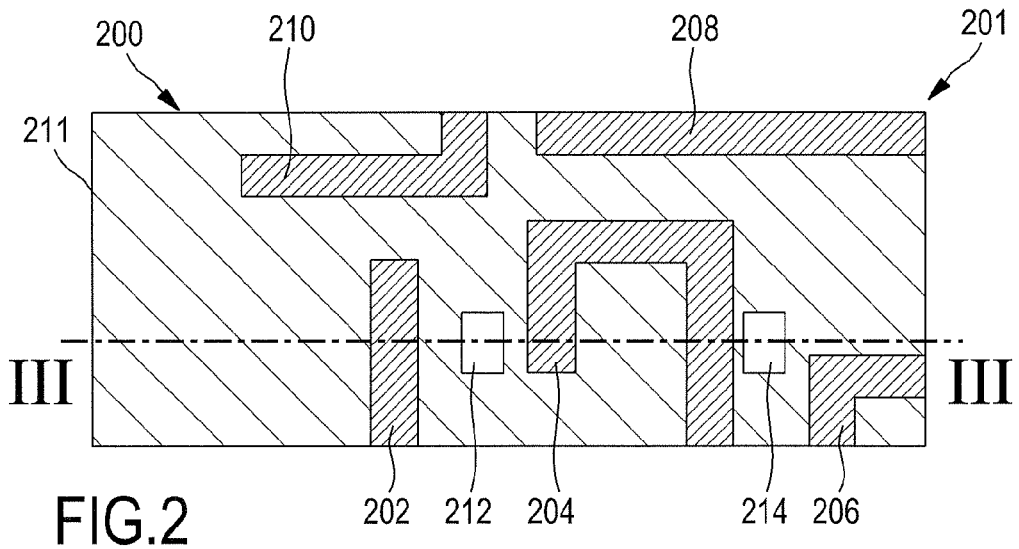
FIG. 2 shows a schematic top view of a surface of an interconnect stack of an integrated-circuit device during fabrication.

FIG. 2 shows a schematic top view of a surface section of an interconnect stack 200 of an integrated-circuit device 201 during fabrication. The illustration of FIG. 2 is schematic in that its combines the design of different mask steps. Not all structural elements shown in FIG. 2 would thus be visible at the same time, in the way represented in FIG. 2, as will become clear during the following description. Hatched areas indicate the position and extension of metal interconnect line sections 202 to 210, which are embedded in an intermetal dielectric layer (not shown in this view). Note that the formation of the metal interconnect line sections is performed before the deposition of an upper etch-barrier layer 211, which at the same time forms (and will also be referred to as) a hard mask for a mask step described next. Namely, two openings 212 and 214 are provided in the upper etch-barrier layer 211 for the formation of etch vias. The mask 211 is made of silicon carbide SiC. Note that structure shown in FIG. 2 is an illustrative example and does not necessarily reflect a section of a real mask layout.

Figure 3:
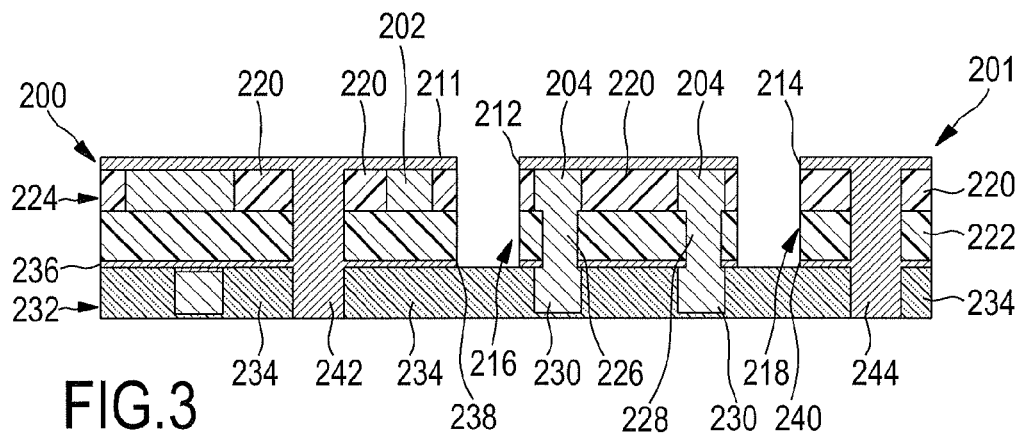
FIGS. 3 to 6 show a cross-sectional view of an upper region of the interconnect section along the line III-III in FIG. 2 at different processing stages.

A dashed line III-III indicates the position of a sectional plane of the interconnect stack 200. A corresponding cross-sectional view is shown in FIG. 3. FIG. 3 shows the hard mask or upper etch-barrier layer 211 with the openings 212 and 214. Etch vias 216 and 218 have been prepared by dry etching through an intermetal dielectric layer 220 and an interlevel dielectric layer 222. However, this step can be also performed using a chemical etching (wet or dry) adapted to the dielectric materials integrated at the last via and metal levels. The intermetal dielectric layer 220 is typically made of USG (undoped silicon glass), whereas the interlevel dielectric layer 222 is made of porous SiLK resin, which material is known in the art. The intermetal dielectric layer 220 embeds the metal interconnect sections 202 and 204 so as to form an upper-intermediate interconnect level 224. The interlevel dielectric layer 222 embeds via sections 226 and 228, which connect the metal interconnect sections 204 to metal interconnect sections 230 on a lower-intermediate interconnect level 232.

Between a lower-intermediate dielectric layer 234 and the interlevel dielectric layer 222, a lower etch-barrier layer 236 is arranged. The lower etch-barrier layer 236 is made of silicon carbide SiC, like the upper etch-barrier layer 211. It contains openings 238 and 240 at the same lateral position and with the same lateral extension as the openings 212 and 214 in the upper etch-barrier layer 211. The etch vias 216 and 218 thus extend from the upper etch-barrier layer 211 through the upper-intermediate interconnect level 224, the upper-intermediate interconnect layer 222 and the lower etch-barrier layer 236.

Furthermore, sections 242 and 244 of a lateral etch barrier are visible in the cross-sectional view of FIG. 3. The lateral etch barrier serves to limit a lateral extension of air gaps, which are to be formed in later processing steps, to the area enclosed by the lateral etch barrier. Typically, the lateral etch-barrier defines a rectangular region of the interconnect stack.

Figure 4:
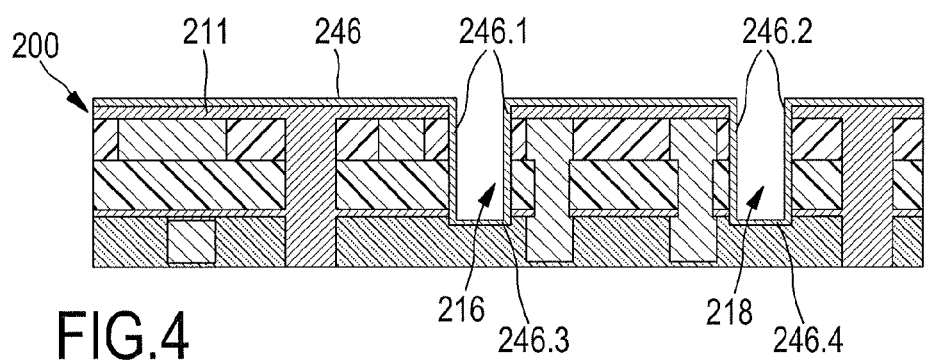

FIG. 4 shows the interconnect stack 200 of FIGS. 2 and 3 at a later processing stage after deposition of an etch-barrier liner 246 on top of the upper etch-barrier layer 211. The etch-barrier liner 246 is made of silicon carbide SiC.

Note that the present embodiment is based on the use of hydrogen fluoride (HF) as a selective etchant for the material of the intermetal dielectric layers, which is USG in this embodiment. As is well known, SiC is impermeable for HF. However, it is understood, that a different material combination can also be used on the basis of the same processing concept. The general concept is that the selective etchant must suitable for removing the material of the intermetal dielectric layers, in which air gaps are to be formed. The material of the interlevel dielectric layers must therefore be chosen to be permeable for the selective etchant on one hand, without, on the other hand, being damaged by the selective etchant.

Figure 5:
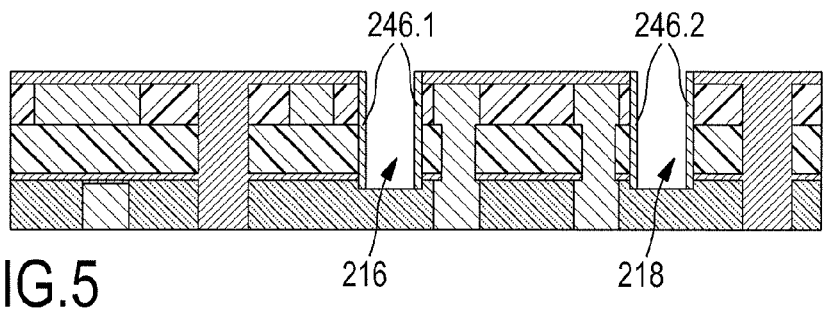

The etch-barrier liner 246 forms a lateral etch-barrier liner 246.1, 246.2 in the etch vias 216, 218. Bottom sections 246.3 and 246.4 in the etch vias 216 and 218 are removed in a subsequent processing step, the result of which is shown in FIG. 5. The removal of the bottom sections 246.3 and 246.4 can be achieved using reactive ion etching (RIE). The etch-barrier liner 246 is removed from the surface of the interconnect stack 200 in this step as well. After this step, the bottom of the etch vias 216 and 218 is open, while the side faces are protected against HF attack by the lateral etch-barrier liner 246.1 and 246.2.

In a subsequent HF etching step, the lower-intermediate intermetal dielectric layer 234 is removed from the interconnect stack inside the region defined by the lateral etch barrier 242, 244. Thus, corresponding air-gap sections 248, 250 and 252 are formed on the lower-intermediate interconnect level 232 while the upper-intermediate interconnect level 224 remains intact, except for the openings 216 and 218. After forming the air gaps 248 to 252, the HF etchant penetrates through a lower-intermediate interlevel dielectric layer 254 inside the lateral limitations defined by the lateral etch barrier 242, 244. The selective etchant thus reaches the next intermetal dielectric layer, which is dissolved to form further air gaps.

Figure 7:
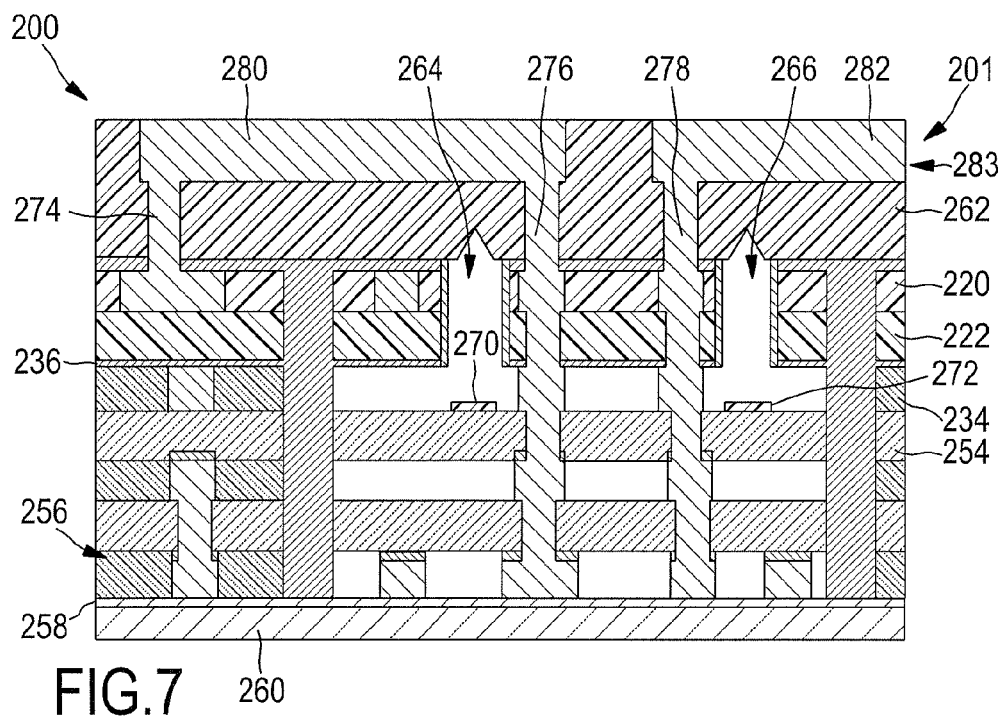
FIG. 7 shows an extended cross-sectional view of the integrated-circuit device of FIGS. 2 to 6 after fabrication of a top interconnect level.

The result of this etching step is shown in an extended cross-sectional view in FIG. 7. Note that the structure shown is of exemplary nature for illustrative purposes. The number of interconnect levels and the details of the layout of the interconnect line sections will vary depending on the function of the particular integrated-circuit device. However, it can clearly be seen that by the processing described heretofore air gaps have been formed on interconnect levels below the lower etch-barrier layer 236. The air gap formation has thus continued to a bottom interconnect level 256. An etch-barrier 258 stops further penetration of the HF-etchant into an underlying substrate 260.

The interconnect stack 200 is finished by depositing a top dielectric layer 262 of USG material using a non-conformal CVD process. This leads to the formation of air cavities 264 and 266 in the (former) etch vias 216 and 218, respectively. Only small amounts of USG material are deposited on the sidewalls of the air cavities 264 and 266 and on top of the lower-intermediate interlevel dielectric layer 254 underneath, shown schematically at reference numerals 270 and 272. The final interconnect stack contains top via sections 274 to 278 and top metal interconnect line sections 280 and 282.

Figure 8:
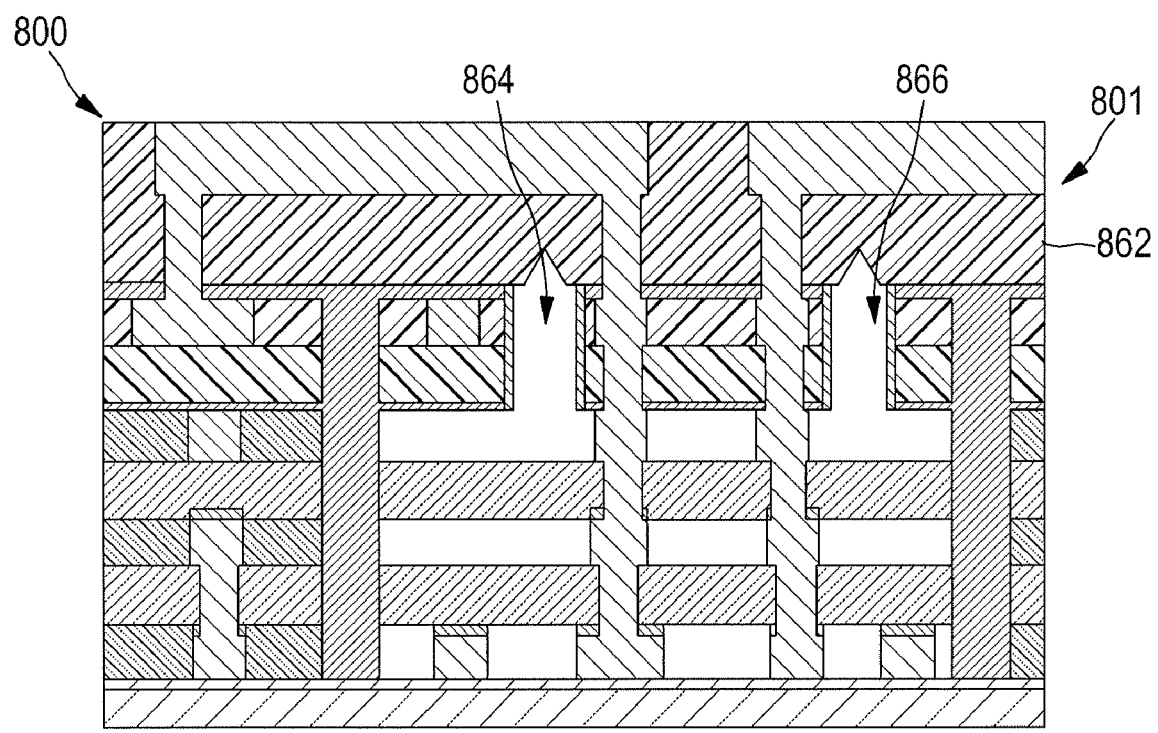
FIG. 8 shows an extended cross-sectional view of the interconnect stack of FIGS. 2 to 6 after fabrication of a top interconnect level according to an alternative embodiment.

FIG. 8 shows an extended cross-sectional view of the interconnect stack of FIG. 2 to 6 after fabrication of a top interconnect level according a second alternative embodiment The structure of the interconnect stack resembles that shown in FIG. 7. The only exception is that air cavities 864 and 866, which correspond to the air cavities 264 and 266 of FIG. 7, do not exhibit any deposition of the dielectric material of the top dielectric layer 862, which corresponds to the top dielectric layer 262 of FIG. 7. This can be achieved by using a selective CVD or a spin-on depositive dielectric process to form the cavities. A suitable selective CVD technology is described in Z. Gabric et al., "Air gap technology by selective ozone/TEOS deposition", Proceedings of the IEEE International Interconnect Technology Conference 2004, p. 151-153 (2004), which is incorporated herein by reference.

Figure 9:
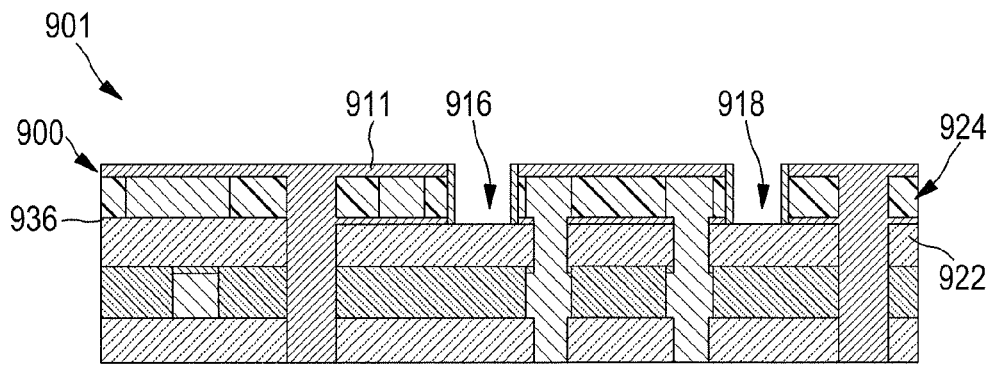
FIGS. 9 and 10 show cross-sectional views of an interconnect stack of an alternative embodiment of an integrated-circuit device at processing stages corresponding to FIGS. 5 and 6.
Figure 10:
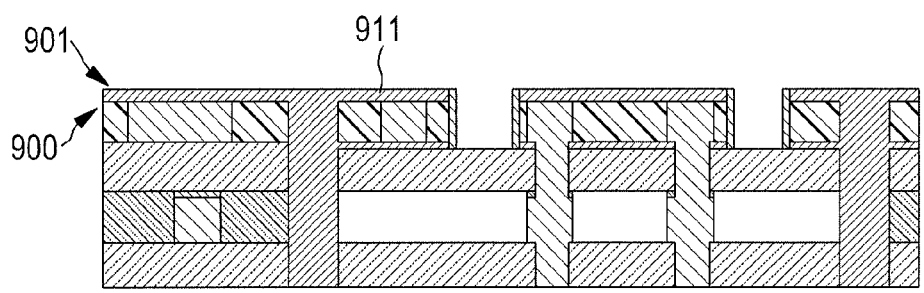
Figure 11:
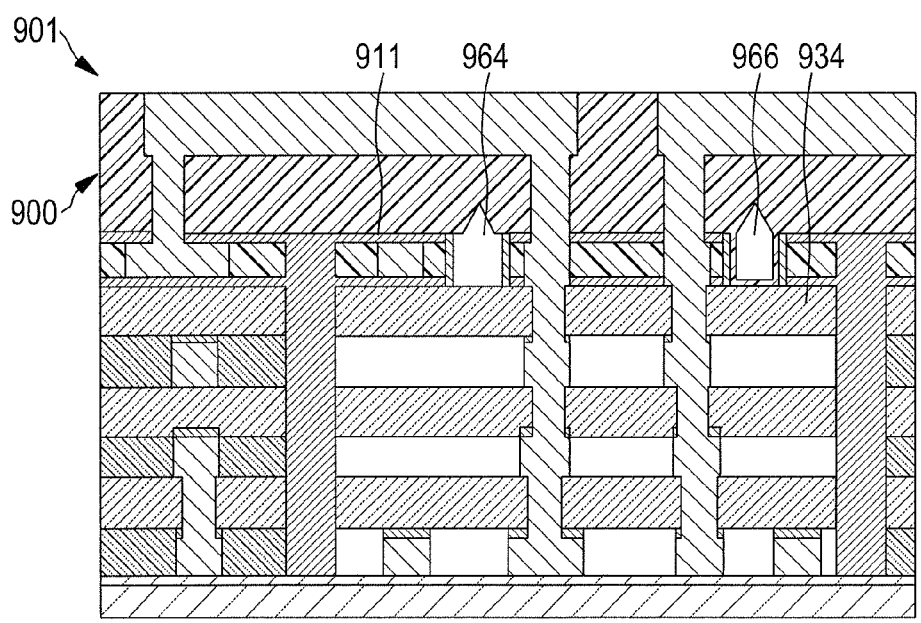
FIG. 11 shows an extended cross-sectional view of the interconnect stack of FIGS. 9 and 10 after fabrication of a top interconnect level according to a further embodiment.

FIGS. 9 to 11 show different processing stages during fabrication of an alternative embodiment of an interconnect stack 900 for an integrated-circuit device 901. The processing stages shown correspond to those of FIGS. 5, 6, and 7 of the previous interconnect-stack embodiment 200. The general structure of the interconnect stack 900 of the present embodiment thus resembles that of interconnect stack 200 of the previous embodiment. The following description focuses on the structural differences between the embodiments. For structural elements, which correspond to those of the previous embodiment, reference numerals will be used that correspond to those of the previous embodiment except for the first digit, which will be 9 instead of 2.

Figure 6:
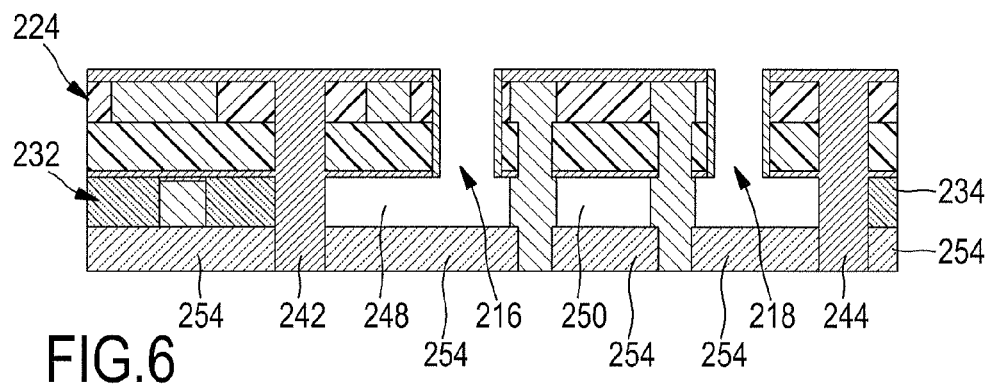

Unlike the interconnect stack 200 of FIGS. 5, 6 and 7, the interconnect stack 900 contains the lower etch-barrier layer 936 immediately underneath the upper-intermediate interconnect level 924. The etch vias 916 and 918 therefore have a reduced length and end on the interlevel dielectric layer 922, which corresponds to interlevel dielectric layer 222 of FIGS. 5 to 7. The further processing, however, is similar to that described earlier resulting in an interconnect stack with reduced length of air cavities 964 and 966. Note that also in this embodiment alternative deposition techniques can be used for the dielectric material on top the upper etch-barrier layer 911. To summarize the options, FIG. 11 shows the air cavity 966 as formed according to a non-conformal CVD technique, with some dielectric material deposited on the side walls and on the interlevel dielectric layer 934. In contrast, air cavity 964 is shown as processed according to a selective CVD technique, as described above.

Figure 12:
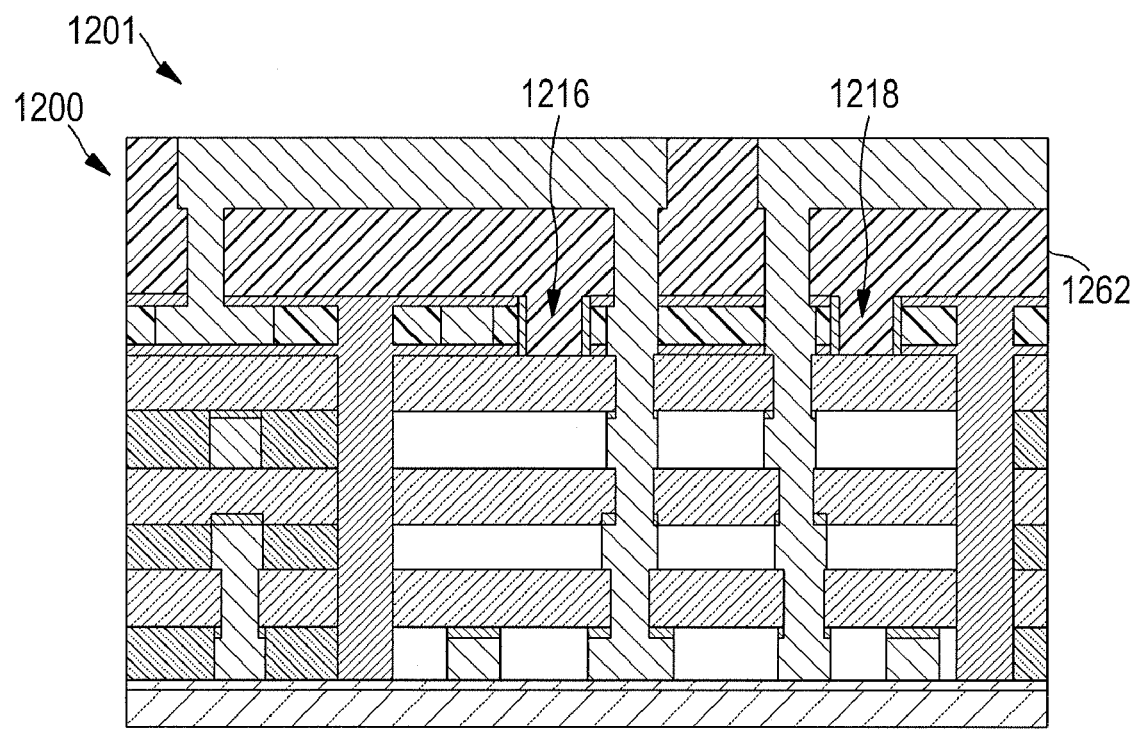
FIG. 12 shows an extended cross-sectional view of the interconnect stack of FIGS. 9 and 10 after fabrication of a top interconnect level according to a second alternative embodiment.

FIG. 12 shows an alternative embodiment of an integrated-circuit device 1201 similar to that of FIG. 11, except for the fact that the former etch vias 1216 and 1218 have been filled with the dielectric material of the top interconnect level 1262 in a gap-filling spin-on technique.

When interpreting the present description and its associated claims, expressions such as "comprise", "include", "incorporate", "contain", "is", and "have" are to be construed in a non-exclusive manner, namely construed to allow for other items or components, which are not explicitly defined, also to be present. Reference to the singular is also to be construed to be a reference to the plural and vice versa.

Furthermore, the invention may also be embodied with less components than provided in the embodiments described here, wherein one component carries out multiple functions. Just as well may the invention be embodied using more elements than depicted in the Figures, wherein functions carried out by one component in the embodiment provided are distributed over multiple components.

A person skilled in the art will readily appreciate that various parameters disclosed in the description may be modified and that various embodiments disclosed and/or claimed may be combined without departing from the scope of the invention.

It is stipulated that the reference signs in the claims do not limit the scope of the claims, but are merely inserted to enhance the legibility of the claims.

The invention claimed is:
1. An integrated-circuit device containing an interconnect stack on a substrate, the interconnect stack comprising
a plurality of interconnect levels containing a bottom interconnect level at a smallest distance from a reference surface of the substrate and a top interconnect level at a largest distance from the reference surface, metal interconnect line sections, which extend parallel to the reference substrate surface and between intermetal-dielectric layer sections on a respective interconnect level, an upper etch-barrier layer, which is arranged on an upper-intermediate interconnect level below the top interconnect level and which is impermeable for a selective etchant that attacks the intermetal-dielectric layer sections, and a lower etch-barrier layer, which is arranged below the upper-intermediate interconnect level and which is impermeable for the selective etchant, wherein the upper and lower etch-barrier layers each contain at least one etch opening defined by a lateral etch-barrier liner, which extends from the etch opening in the upper etch-barrier layer to the etch opening in the lower etch-barrier layer and which is impermeable for the selective etchant, and wherein airgaps are present on one or more interconnect levels, which are arranged below the lower etch-barrier layer; and further comprising a lateral etch barrier, which is impermeable for the selective etchant, extends from the upper etch-barrier layer to the bottom interconnect level, and laterally limits a region of airgap presence;

further comprising metal vias for connecting interconnect line sections of two neighboring interconnect levels, and interlevel-dielectric layer sections extending parallel to the reference substrate surface between the metal vias and between the respective neighboring interconnect levels;

wherein the interlevel-dielectric layer sections are made of a material that is permeable for the selective etchant.

2. The integrated-circuit device of claim 1, wherein an aircavity extends between the etch openings in the upper and lower etch-barrier layers.

3. The integrated-circuit device of claim 1, wherein the etch openings in the upper and lower etch-barrier layer are filled with a dielectric material.

4. The integrated-circuit device of claim 1, wherein the lower etch-barrier layer is arranged on top of a lower-intermediate interconnect level, which is situated below the upper-intermediate interconnect level.

5. The integrated circuit-device of claim 1, wherein the lower etch-barrier layer is arranged between the upper-intermediate interconnect level and an interlevel-dielectric layer next below.

6. A method for fabricating an interconnect stack of an integrated-circuit device, comprising the formation of a plurality of interconnect levels, from a bottom interconnect level at a smallest distance from a reference surface of a substrate to a top interconnect level at a largest distance from the reference surface, the method comprising the steps of:

fabricating respective interconnect levels, which contain metal interconnect line sections extending parallel to the reference substrate surface and between intermetal-dielectric layer sections of the respective interconnect level, fabricating a lower etch-barrier layer, which is impermeable for a selective etchant that attacks the intermetal-dielectric layer sections, either on top of a lower-intermediate interconnect level or immediately before fabrication of an upper-intermediate interconnect level, fabricating an upper etch-barrier layer on top of the upper-intermediate interconnect level, the upper etch-barrier layer being impermeable for the selective etchant, fabricating at least one respective etch opening in the upper and lower etch-barrier layers, and at least one respective etch via connecting two respective etch openings on the upper and lower etch-barrier layers, fabricating a lateral etch-barrier liner, which extends along side walls of the etch via and is impermeable for the selective etchant, and fabricating airgaps on one or more interconnect levels, which are arranged below the lower etch-barrier layer, by applying the selective etchant through the etch via; and further comprising, before the step of fabricating airgaps, a step of fabricating a lateral etch barrier using a material, which is impermeable for the selective etchant, from the upper etch-barrier layer to the bottom interconnect level; and further comprising, before the step of fabricating airgaps, a step of removing a bottom section of the lateral etch-barrier liner in the at least one respective etch via.

7. The method of claim 6, comprising, before a step of forming the top interconnect level, a step of depositing a top interlevel dielectric layer by a deposition technique that will not fill the etch via.

8. The method of claim 6, comprising, before a step of forming the top interconnect level, a step of depositing a top interlevel dielectric layer by a technique that will fill the etch via.

* * * * *